United States Patent [19]

Steuernagel et al.

[11] 4,305,039
[45] Dec. 8, 1981

[54] IR CORRECTED ELECTROCHEMICAL CELL TEST INSTRUMENT

[75] Inventors: Werner H. Steuernagel; John C. Noll, both of Tolland; Gary Putnam, Manchester, all of Conn.

[73] Assignee: United Technologies Corporation, Hartford, Conn.

[21] Appl. No.: 107,230

[22] Filed: Dec. 26, 1979

[51] Int. Cl.³ ............................................. G01N 27/42
[52] U.S. Cl. ................................... 324/425; 324/429
[58] Field of Search ......................... 324/425, 429, 430

[56] References Cited

U.S. PATENT DOCUMENTS

| | | | |
|---|---|---|---|
| 3,230,452 | 1/1966 | Angello | 324/429 |
| 3,405,352 | 10/1968 | Wondra | 324/429 |
| 3,624,481 | 11/1971 | Macharg | . |
| 3,761,795 | 9/1973 | Clayton | . |
| 3,890,556 | 6/1975 | Melling | . |

Primary Examiner—Michael J. Tokar
Attorney, Agent, or Firm—Richard P. Lange

[57] ABSTRACT

A test instrument for an electrochemical cell generates a current which counteracts the cell current so that it is briefly reduced to zero thereby allowing the electrode potential or cell potential to be measured free from the IR or ohmic polarization loss. A sample and hold circuit is enabled shortly after the current is interrupted to sense the voltage level of the electrode or electrochemical cell which has only experienced the voltage change due to the IR polarization losses. When cell current is restored, the IR corrected potential stored in the sample and hold circuit is compared to the control potential, and the difference between the two causes automatic adjustment of the average cell current such that the IR corrected potential of the cell is maintained despite any changes in IR polarization.

6 Claims, 4 Drawing Figures

IR CORRECTED ELECTROCHEMICAL CELL TEST INSTRUMENT

TECHNICAL FIELD

This invention relates to a test instrument for measuring the voltage losses in an electrochemical cell. More particularly, the invention relates to a test instrument which can measure the IR polarization of the electrochemical cell and through a feedback arrangement serve as a potentiostat to control the electrode or cell to a desired IR compensated potential.

BACKGROUND ART

Electrochemical cells have been used for many years to produce or consume an electrical current by means of a chemical reaction. In the design and improvement of electrolyte and electrodes used in an electrochemical cell it is often necessary to determine where losses occur so that an attempt can be made to improve the voltage efficiency of the cell. As is well known, there are three principal types of voltage losses in an electrochemical cell; ohmic or IR polarization, activation polarization and concentration polarization. The IR polarization is associated with the voltage gradient that is necessary, to drive the charged ions through the cell electrolyte, and to drive electrons through the electrode and other conductive material. The activation polarization loss is somewhat harder to appreciate and is related to the irreversibility of the electrochemical reactions in the cell under current drain. The concentration polarization loss is the third source of voltage loss and is related to the resistance to mass transport of the reacting species. A more complete discussion of these losses is found in HANDBOOK OF FUEL CELL TECHNOLOGY by Carl Berger, published in 1968.

In the measurement of these voltage losses it is desirable to measure the activation polarization and concentration polarization independent of the IR polarization. One known way of making this IR correction to cell voltage utilizes the known fact that of the three different types of losses, the IR polarization loss is the only one which, in essence, changes almost instantaneously if the current through an electrochemical cell is varied. Accordingly, this method involves the use of an oscilloscope, or the like, which is connected to read the voltage level of the electrochemical cell. The current through the cell is interrupted; then, the resultant voltage change that occurs shortly after the current change, this time frame being on order of microseconds, is measured. Because the variables associated with the activation polarization losses and the concentration polarization losses have not yet been reflected in the voltage change, this initial voltage change reflects primarily only IR polarization losses.

There are a number of problems with this just mentioned method of measuring the IR polarization in an electrochemical cell. It is time consuming and has inherent inaccuracies associated with measuring the voltage changes within the precise time frame required; manual adjustment of the instrument is required if the cell is to be operated at a particular IR corrected potential; and these adjustments are not available to compensate the cell for rapid changes in IR.

DISCLOSURE OF INVENTION

It is a primary object of the present invention to provide a test instrument for use with an electrochemical cell to measure and control cell voltages which have been compensated for ohmic losses.

According to a feature of the test instrument for an electrochemical cell according to the present invention, the test instrument can act as a potentiostat circuit to measure and control the IR corrected voltage, and also can operate as a galvanostat to measure the IR corrected cell voltage.

According to yet another feature of the present invention, a test instrument for use with an electrochemical cell determines the IR corrected cell losses by generating a cell interrupt current from a feedback signal which is proportional to the magnitude of cell current. While the cell current is interrupted, a sample and hold circuit is again activated to update the voltage magnitude associated with the IR corrected cell voltage.

According to another feature of the present invention a test instrument for use with an electrochemical cell interrupts the current in an electrochemical cell to automatically measure the IR corrected potential of the electrode or the cell. An interrupt current is generated by a differential amplifier which compares a feedback signal that is proportional to cell current to ground potential. A power amplifier then generates a current whose magnitude is equal to the current that is flowing through the electrochemical cell but of opposite polarity. Accordingly, the cell current is almost instantaneously interrupted and the sample and hold unit is activated to measure the resistance free cell voltage before the voltage change associated with the activation polarization and concentration polarization has occurred.

BEST MODE FOR CARRYING OUT THE INVENTION

Figure 1:
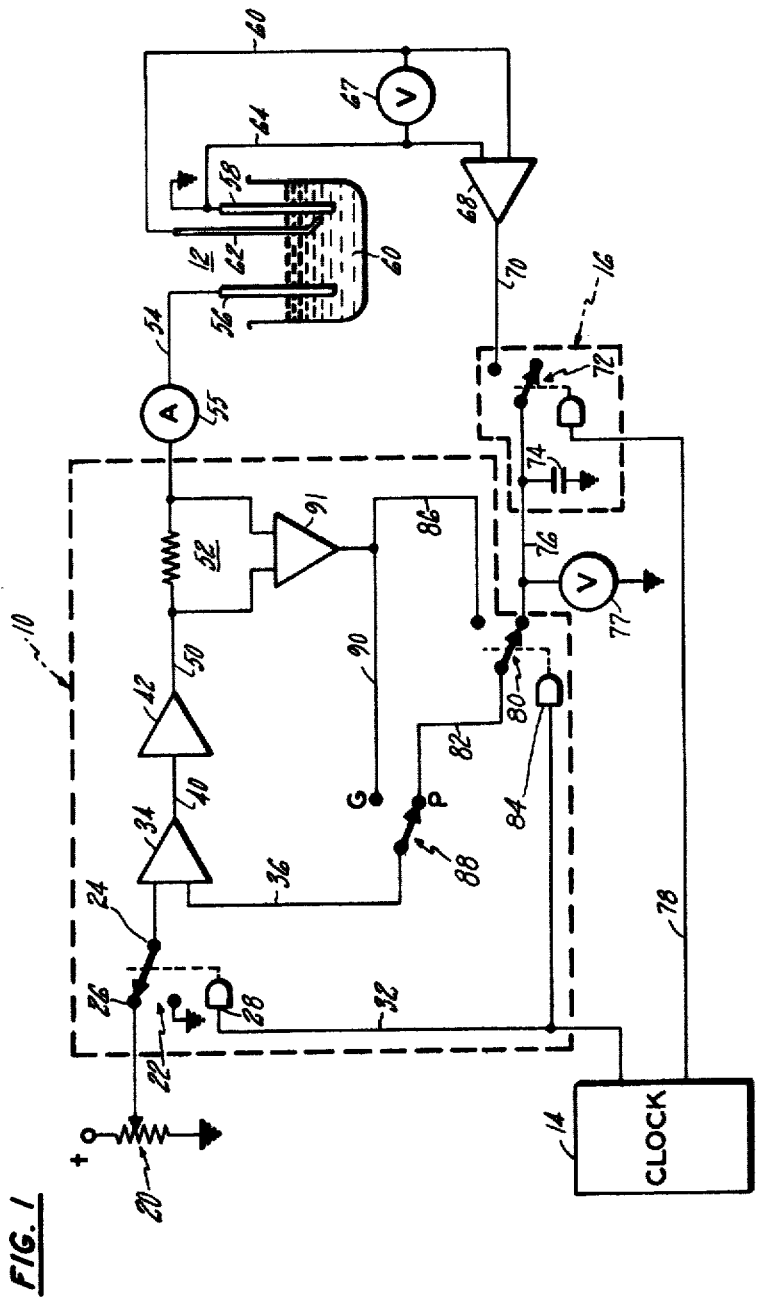
FIG. 1 is a block diagram of a test circuit according to the present invention for use with an electrochemical cell.

Referring initially to FIG. 1, there is seen an embodiment of a test instrument according to the present invention for measuring and controlling the IR corrected voltage of an electrode or electrochemical cell. A control circuit 10 is connected in the current path to the electrochemical cell 12 for periodically interrupting the cell current, and is periodically enabled by a clock 14. A sample and hold unit 16, also controlled by the timing circuit 14, samples the voltage of the electrochemical cell 12 just after the interrupt period has been initiated to derive the IR corrected voltage level which is indicative of an electrode or cell voltage at the particular current flow through the electrochemical cell.

Figure 2:
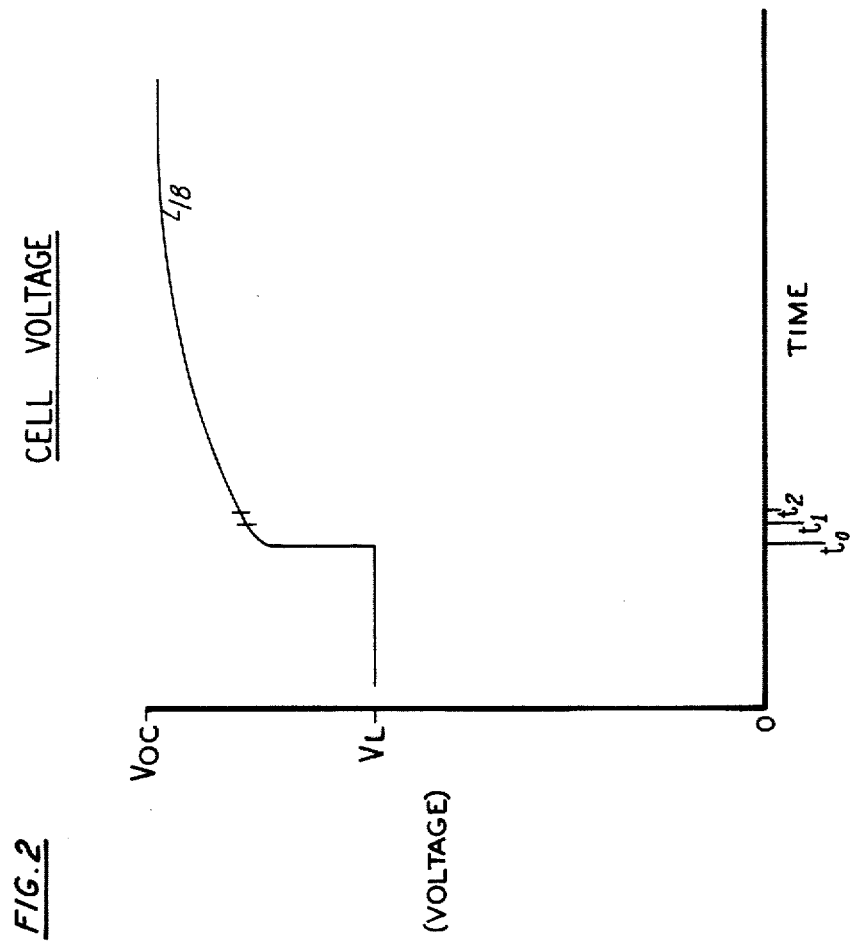
FIG. 2 is a graph of the voltage waveform of an electrochemical cell as the cell current is interrupted.

The reason for this phenomenon might be best understood by reference to FIG. 2 which is a graph of the voltage waveform versus time of a typical electrochemical cell as the cell current is forced from a certain magnitude of current to zero. Of course, as is well known, the open circuit voltage $V_{oc}$ occurs when no current flows through the cell and the voltage level under load, $V_L$, is lower than $V_{oc}$ due to losses within the electrochemical cell 12. Prior to $t_0$, the electrochemical cell 12 is operating under a load. At time $t_0$ in FIG. 2, the clock 14 provides a control pulse to the control circuit 10 causing it to generate a pulse of current which is of a magnitude and polarity sufficient to precisely counter the cell current in the electrochemical cell 12. This essentially forces the current through the electrochemical cell toward zero and controls the current at that level so that the cell voltage begins to rapidly move toward its no load or open circuit potential $V_{oc}$, as is seen by waveform 18. By time $t_1$, approximately 15 microseconds later, the sample and hold circuit 16 is transitioned to its sample mode and stores the average voltage during this sample period, i.e. from $t_1$ to $t_2$. Because the voltage change associated with the activation polarization and the concentration polarization has yet to be reflected in this waveform, the remaining voltage difference to the no load voltage is primarily associated with the activation polarization and the concentration polarization losses.

Referring again to FIG. 1, the embodiment of a test instrument has the capability to function as a potentiostat, to control the desired IR corrected voltage level of an electrode or the overall cell potential, or as a galvanostat capable of measuring an IR corrected potential. A variable voltage source 20 is provided and can be adjusted to vary the amount of either the current or voltage of the electrochemical cell 12. The interrupt circuit 10 includes a switch 22 which has a common terminal 24 that is normally coupled through to the terminal 26. A control terminal 28 is also provided so that when a suitable digital signal is presented thereto, the common terminal 24 is switched from the terminal 26 to a second terminal 30. The second terminal 30 is connected to ground. The control terminal 28 is connected to the clock 14 via a line 32.

A differential amplifier 34, is provided to compare a feedback signal on the line 36 with the input signal provided on a line 38 from the analog switch 22. The voltage output from the differential amplifier 34 is presented by a line 40 to a power amplifier 42 which essentially generates a current at its output terminal of a magnitude that is proportional to the magnitude of the voltage received at its input terminal. The output of the power amplifier 42 is connected by a lead 50 to a shunt 52 and on by a lead 54 to the electrochemical cell 12. An ammeter 55 can be located in the line 54 to measure the magnitude of the current in the electrochemical cell 12.

As mentioned briefly heretofore, the electrochemical cell 12 is a well-known device for generating or consuming DC electrical energy by means of a chemical reaction. Such a cell includes a pair of electrodes, often called an anode and a cathode, either of which can be the working electrode 58, or the counter electrode 56. The electrolyte 60 is positioned between these two electrodes. The theory and operation associated with electrodes and electrolyte is indeed a complex and complicated discipline. However, for the purpose of understanding the present invention it is sufficient to observe that an ion flow occurs through the electrolyte between the electrodes and it is proportional to the magnitude and direction of the electrical current of the cell. Accordingly, in the design of both electrodes and electrolyte it is exceedingly helpful to be able to measure the losses associated with a particular electrode or electrolyte. In measuring the voltage losses associated with a particular design, a reference electrode 62 is often used, the end of which is normally positioned in close proximity to the working electrode 58 to accurately measure the cell voltage independent of any losses associated with polarization of counter electrode 56. The difference between the voltage of the working electrode 58 and the voltage on the reference electrode 62 is presented via the line 64 and 66 to the inputs of a differential amplifier 68. A voltmeter 67 may be connected across the lines 64 and 66 to directly read the cell voltage level. The output of the differential amplifier 68 is presented to the sample and hold 16 via the line 70.

Although numerous different types of sample and hold units are known, one type might include a switch 72 and a storage device, such as capacitor 74, for storing the sampled voltage level. In the "hold" position the voltage level stored on the capacitor 74 would be read out on line 76. A control terminal of the sample and hold unit 16 is connected by a line 78 to the clock 14 and can be enabled by a suitable pulse presented to its control terminal. Accordingly, the capacitor 74 is charged to the existing voltage level on the line 70 during the sample period, which is the IR corrected voltage of the electrochemical cell 12. A voltmeter 77 may be provided for directly reading the IR corrected voltage level.

A switch 80 has its normally closed path connected to receive the signal on the line 76 and pass it to its output on the line 82. In response to a suitable signal supplied to its control terminal 84, the switch transitions to couple the signal on a line 86, which is from an amplifier 91 in the shunt 52, to the line 82. Thus, the switch 88 provides the feedback signal to amplifier 34 that is proportional to the cell current.

A particular feature of the IR corrected test instrument according to the present invention is that it can be easily switched between a potentiostatic mode to measure current as a function of IR corrected voltage and a galvanostatic mode to measure IR corrected voltage as a function of current. In the potentiostatic mode the mode switch 88 is in the P position, as shown in FIG. 1. The adjustable voltage source 20 can then be varied to cause the electrochemical cell 12 to provide that load current which corresponds to a particular IR corrected voltage level. This voltage level is thereby controlled by the instrument.

Figure 3:
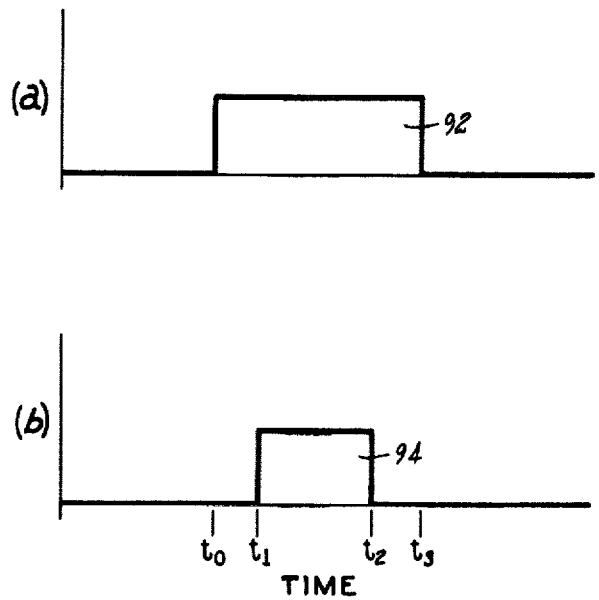
FIG. 3 is a graph of a general timing diagram for the test circuit of FIG. 1.

Referring to FIG. 3 in addition to FIG. 1, there is seen a general timing diagram depicting the relationship of pulses from the clock 14. The timing circuit 14 causes the control circuit 10 to force the current through the electrochemical cell to zero for a period of approximately 50 microseconds by providing a pulse 92 (illustration (a) of FIG. 3) on the lines 32 and 84 which transition the analog switches 22 and 80. The differential amplifier 34 then has presented to its inputs a ground potential and a voltage level which is proportional to the existing load current through the shunt 52. This results in the generation by the power amp 42 of an instantaneous current which is equivalent in magnitude and of opposite polarity to that in the electrochemical cell 12, all this occurring within a short period, i.e. 4–5 microseconds. This counteracting current forces the current in the electrochemical cell 12 to zero. By time $t_1$, the current in the cell 12 has been completely interrupted and the clock 14 presents a pulse 94 (illustration (b) of FIG. 3) to the sample and hold unit 16 which transitions it to the "sample" state for the period $t_1$ to $t_2$, or approximately 15 microseconds. During this period, the capacitor 74 charges to the voltage level on the line 70 and by $t_2$ the sample and hold 16 switches back to the "hold" state. Finally, at time $t_3$ the analog switches 22 and 80 are transitioned back to the normal mode at the end of pulse 92 and the cell current reverts to a level related to the IR corrected voltage as dictated by the variable voltage source 20. Since the interrupt period can be relatively short, i.e. about 50 microseconds, to accurately measure the IR corrected voltage, the repetition rate for the pulse 92 can be high, on the order of 10 milliseconds, if desired. However, it should be understood that other repetition rates could be used. Also, it may be desirable to vary the time relationship between pulse 92 and pulse 94 for testing different types of electrodes.

In order to operate in the galvanostatic mode so that the IR corrected voltage across the electrochemical cell 12 can be measured as a function of load current, the mode switch 88 is transitioned to the G position as shown in FIG. 1. As can be noted, the feedback signal on the line 36 presented to the error amplifier 34 would then be proportional to the load current through the shunt. In turn, the current generated by the error amp 34 and power amp 42 combination is then proportional to the voltage difference across the inputs to the differential amp 34. As a result, the cell current can be varied by changing the adjustable voltage source 20. The IR corrected voltage level is then presented to the voltmeter 77 as just heretofore described with respect to the potentiostatic mode.

There are numerous types of switches that could be used in the embodiment of the test instrument shown in FIG. 1. One switch that is suitable for this application is a dual analog transmission gate Model No. DG200B manufactured by Siliconix. This switch is well suited for use in the test circuit because its single throw dual pole pathway is designed for use with analog signal but its control circuit is designed for use with digital circuits so that the unit can be rapidly switched.

Although the invention has been shown and described with respect to the preferred embodiment thereof, it should be understood by those skilled in the art that various changes and omissions in the form and detail thereof may be made therein without departing from the spirit and scope of the invention.

We claim:

1. A test instrument for use with an electrochemical cell, comprising:
   control means attached to said electrochemical cell for generating a current to cause the current in said electrochemical cell to be interrupted for a predetermined length of time;
   means connected to said control means for sampling the voltage level of said electrochemical cell during said predetermined period and for holding said voltage level;
   whereby said held voltage level is indicative of the voltage of said electrochemical cell in the absence of IR polarization.

2. A test instrument according to claim 1, wherein said control means includes a shunt connected in series with the current path to said electrochemical cell, and wherein said control means includes an amplifier means having a pair of input terminals, one of which is connected to receive a feedback signal from said shunt means which is indicative of the current therethrough, and the other of said pair of input terminals receives a control signal which causes said amplifier means to generate a current for interrupting the current flow through said electrochemical cell for a predetermined length of time.

3. A test instrument according to claim 2, wherein said control means includes a switch means through which said control signal passes, and wherein said switch means includes a first terminal which is connected to a variable voltage source and a second terminal that is connected to ground, and wherein said switch is transitioned from said first terminal to said second terminal for a predetermined length of time thereby causing said amplifier means to generate a current which balances the current in said electrochemical cell.

4. A test circuit according to claim 1, further including a mode switch for allowing said test instrument to act as a potentiostat to control the IR corrected cell voltage, or to act as a galvanostat to measure the IR corrected cell voltage.

5. A test instrument according to claim 1, further including a voltmeter means connected to the output of said sample means for reading out the voltage level during said predetermined period, said voltage level being the IR corrected voltage level.

6. A test instrument according to claim 1, wherein said voltage level sampled during said predetermined period is an IR corrected voltage level and is presented to a storage device, and wherein said IR corrected voltage level from said storage device is compared with a reference level at times other than during said predetermined period to form a feedback signal that proportionally controls the current level in said electrochemical cell.

* * * * *